Oct. 22, 1963 D. J. CARLSON ETAL 3,108,231

NEGATIVE RESISTANCE AMPLIFIER

Filed Feb. 29, 1960

INVENTORS.
DAVID J. CARLSON &
WEN YUAN PAN

BY Eugene M. Whitacre
Attorney

United States Patent Office 3,108,231
Patented Oct. 22, 1963

3,108,231
NEGATIVE RESISTANCE AMPLIFIER
David J. Carlson and Wen Yuan Pan, Haddon Heights, N.J., assignors to Radio Corporation of America, a corporation of Delaware
Filed Feb. 29, 1960, Ser. No. 11,876
5 Claims. (Cl. 330—34)

This invention relates to amplifiers utilizing negative resistance devices, and particularly to circuit arrangements for such amplifiers whereby the signal handling capabilities may be increased without increasing distortion.

A variety of negative resistance devices are discussed in an article entitled "Negative Resistance and Devices for Obtaining It" by E. W. Herold, appearing in the October 1935 issue of the Proceedings of the IRE, at pages 1201 through 1223. As noted in the Herold article, two main classes of negative resistances exist: (*a*) a voltage controlled negative resistance; and (*b*) a current controlled negative resistance. In an article entitled "Tunnel Diodes as High Frequency Devices," by H. S. Sommers, Jr. appearing in the July 1959 issue of the Proceedings of the IRE, at pages 1201 through 1206, a particular device of the voltage controlled negative resistance type is discussed in detail. This form of voltage controlled negative resistance device has become known as a tunnel diode, the name being derived from the process of quantum mechanical tunneling of charge carriers, which process, it is theorized, contributes to the production of the negative resistance characteristic in the device. In an article entitled "Low Noise Tunnel Diode Amplifier," by K. K. N. Chang, also appearing in the July 1959 Proceedings of the IRE, at pages 1268 through 1269, an application of the tunnel diode device to amplifier use is described in detail.

An important problem to be considered in the use of negative resistance devices in amplifying systems is that of obtaining adequate signal handling capability without a large amount of distortion. Negative resistance devices generally exhibit a peaked negative resistance characteristic. That is, for voltage controlled negative resistance devices, the absolute value of the negative resistance decreases from an infinite value to a minimum value at the peaked portion of the characteristic, and then increases, as the forward bias voltage is continuously increased. In a case of a current controlled negative resistance device, the absolute value of the negative resistance increases from zero to a maximum absolute value, and then again decreases to zero as the current in the forward direction through the device is continuously increased.

The gain of an amplifier using a negative resistance device is a function of the relationship of the negative and positive resistances or conductances in the circuit. For minimum distortion the negative resistance of the device should be substantially the same over the entire excursion of the signal to be amplified, so that one portion of the signal wave will not be amplified more than the other portions. Thus for minimum distortion, the negative resistance device is usually biased for operation at the peak of its negative resistance characteristic and is restricted to applied signal levels which are small enough so that they do not substantially affect the average negative resistance of the device. In exemplary circuits, the amplifier is restricted to a very narrow operating range of applied signal amplitudes to avoid distortion, generally up to 10 millivolts (mv.). If large amplitude signals are applied, the peaks of the signals are not amplified as much as the remainder of the signal causing distortion.

It is accordingly an object of this invention to provide improved signal amplifying systems using negative resistance devices.

Another object of this invention is to provide improved negative resistance amplifiers having a wider signal handling range than known types of negative resistance amplifiers.

An amplifier circuit in accordance with the invention includes a pair of negative resistance devices having similar operating characteristics over at least a portion of their dynamic ranges. The negative resistance devices are biased for operation on a portion of their negative resistance characteristics, and are connected in circuit so that an applied signal wave causes the negative resistance of one of the devices to increase and the negative resistance of the other device to decrease by substantially the same amount. In this manner, the average negative resistance of the circuit as a whole remains substantially constant for relatively large amplitude signal excursions. Accordingly, an amplifier stage in accordance with the invention is capable of translating much larger signal levels with low distortion than an amplifier stage using only a single negative resistance device biased without attention to the compensating features provided in accordance with the invention.

The novel features that are considered to be characteristic of this invention are set forth with particularity in the appended claims. The invention itself, however, both to its organization and method of operation as well as additional objects and advantages thereof, will be best understood from the following description when read in connection with the accompanying drawings, in which:

FIGURE 1 is a sectional view of the tunnel diode which may be used in negative resistance amplifying circuits embodying the invention;

FIGURES 2*a*, 2*b*, and 2*c* illustrate graphically characteristics of a voltage controlled negative resistance device as an aid in explaining the operation of the embodiment of the invention shown in FIGURE 3;

Figure 1:
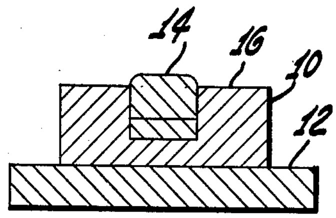

Reference is now made to FIGURE 1 which is a diagrammatic sectional view of a typical negative resistance diode that may be used in circuits embodying the invention and which has a thin or abrupt junction diode exhibiting a negative resistance over a region of low forward bias voltages, i.e., less than 0.3 volt. The diode which is known as a tunnel diode, was prepared with a semiconductor having a free charge carrier concentration several orders of magnitude higher than that used in conventional diodes.

A diode which was constructed and could be used in practicing the invention includes a single crystal bar of n-type germanium which is doped with arsenic to have a donor concentration of $4.0 \times 10^{19}$ cm.$^{-3}$ by methods known in the semiconductor art. This may be accomplished, for example, by pulling a crystal from molten germanium containing the requisite concentration of arsenic. A wafer 10 is cut from the bar along the 111 plane, i.e. a plane perpendicular to the 111 crystallographic axis of the crystal. The wafer 10 is etched to a thickness of about 2 mils with a conventional etch solution. A major surface of this wafer 10 is soldered to a strip 12 of a conductor, such as nickel, with a conventional lead-tin-arsenic solder, to provide a non-rectifying contact between the wafer 10 and the strip 12. The nickel strip 12 serves eventually as a base lead. A 5 mil diameter dot 14 of 99 percent by weight indium, 0.5 percent by weight zinc and 0.5 weight percent gallium is placed with a small amount of a commercial flux on the free surface 16 of the germanium wafer 10 and then heated to a temperature in the neighborhood of 450° C. for one minute in an atmosphere of dry hydrogen to alloy a portion of the dot to the free surface 16 of the wafer 10, and then cooled rapidly. In the alloying step, the unit is heated and cooled as rapidly as possible so as to produce an abrupt p-n junction. The unit is then given a final dip etch for 5 seconds in a slow iodide etch solution, followed by rinsing in distilled water. The etching step cleans up the surface of the wafer around the dot to reduce leakage current between the wafer and the dot. A suitable slow iodide etch is prepared by mixing one drop of a solution comprising 0.55 gram potassium iodide, and 100 $cm.^3$ water in 10 $cm.^3$ concentrated acetic acid, and 100 $cm.^3$ concentrated hydrofluoric acid. A pigtail connection may be soldered to the dot where the device is to be used at ordinary frequencies. Where the device is to be used at high frequencies, contact may be made to the dot using low impedance encapsulation techniques.

Other semiconductors may be used instead of germanium, particularly silicon and the III-V compounds. A III-V compound is a compound composed of an element from group III and an element from group V of the periodic table of chemical elements, such as gallium arsenide, indium arsenside and indium antimonide. Where III-V compounds are used, the p and n type impurities ordinarily used in those compounds are also used to form the diode described. Thus, sulfur is a suitable n-type impurity and zinc a suitable p-type impurity which is also suitable for alloying.

Figure 2:
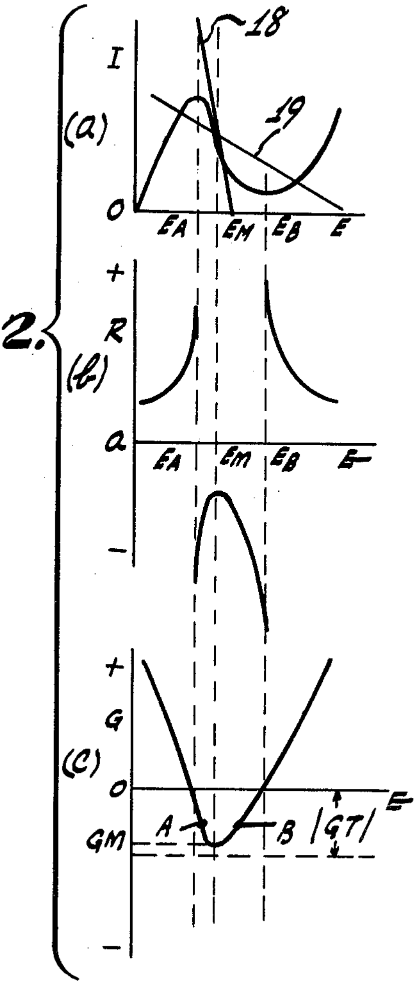

In FIGURE 2*a*, the current versus voltage characteristic of a typical tunnel diode is illustrated graphically. It will be noted that the characteristic possesses three distinct regions of interest. For applied voltages of relatively small values, in the region from zero to $E_A$, the current through the tunnel diode increases as the voltage applied across the tunnel diode increases. Thus, in this first region of relatively small applied voltage values, the tunnel diode exhibits a positive resistance. However, in the next succeeding region of applied voltage values from $E_A$ to $E_B$, a dip in the characteristic occurs. Over this intermediate region, the current through the diode decreases as the voltage applied across the diode increases. Thus, in this intermediate region, the tunnel diode exhibits a negative resistance. In the third region of applied voltage values, i.e. values above $E_B$, the current through the diode returns to a condition of increasing with increases in the voltage applied across the diode. Thus, in this third region, the tunnel diode again exhibits a positive resistance.

In FIGURE 2*b*, the resistance variations of the diode with changes in the applied voltage are shown. In the zero to $E_A$ region the positive character of the resistance may be noted, the positive resistance increasing with applied voltage and approaching infinity at $E_A$. In the intermediate $E_A$ to $E_B$ region, the negative character of the resistance is to be noted, the negative resistance approaching infinity at both the $E_A$ and $E_B$ values, but decreasing through negative values therebetween to a minimum resistance value at an intermediate voltage value $E_M$. A comparison of FIGURES 2*b* and 2*a* reveals that the voltage value $E_M$, at which minimum negative resistance is exhibited, corresponds to the voltage value at which the negative slope of the current versus voltage characteristic is a maximum (i.e. the point of inflection in the negative resistance exhibiting region of the device's current versus voltage operating characteristic). In the third region representing voltage values above $E_B$, the return to a positive character for the exhibited resistance is to be noted, the positive resistance decreasing with applied voltage from a value approaching infinity at $E_B$.

In FIGURE 2*c*, the conductance variations of the tunnel diode with changes in applied voltage are illustrated graphically. It will be noted that the conductance characteristic of FIGURE 2*c* bears the expected reciprocal relationship to the resistance characteristic of FIGURE 2*b*. In the zero to $E_A$ region, the conductance is positive, and decreases from a maximum to a value of zero at $E_A$. In the intermediate $E_A$ to $E_B$ region, the conductance is negative, and increases through negative values from a zero value at $E_A$ to a maximum value $G_M$ at the voltage $E_M$, and then decreases through negative values thereafter to a zero value at $E_B$. In the third region, i.e. for voltage values above $E_B$ the conductance is again positive and increases from a zero value as the voltage is increased above $E_B$.

To bias the diode for stable operation in the negative resistance region of its characteristic requires a suitable voltage source having a smaller internal impedance than the negative resistance of the diode. Such a voltage source has a D.-C. load line 18 as indicated in FIGURE 2*a*, which is characterized by a current-voltage relationship which has a greater slope than the negative slope of the diode characteristic and intersects the diode characteristic at only a single point. If the voltage source has an internal resistance which is greater than the negative resistance of the diode, the source would have a load line 19 with a smaller slope than the negative slope of the diode characteristic as indicated in FIGURE 1, and could intersect the diode characteristic curve at three points. Under the latter conditions the diode is not stably biased in the negative resistance region. This lack of stability is because an incremental change in current through the diode due to transient or noise currents, or the like, produces a regenerative reaction which causes the diode to assume one of its two stable states represented by the intersection of the load line 19 with the positive resistance portions of the diode characteristic curve.

Figure 3:
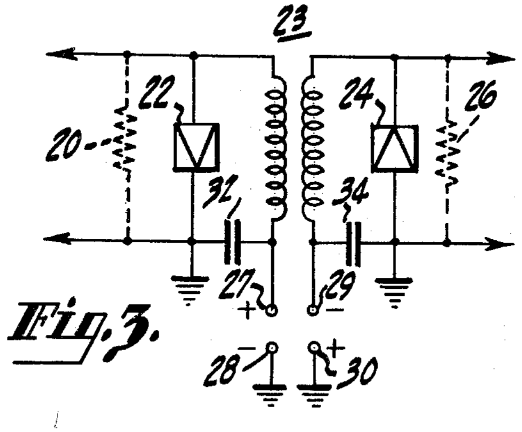
FIGURE 3 illustrates schematically a negative resistance amplifier in accordance with an embodiment of the present invention.

A schematic circuit diagram of an amplifying circuit in accordance with the invention is shown in FIGURE 3. A signal source, not shown, having an equivalent conductance represented by the resistor 20, shown in dashed lines, is connected to apply a signal voltage to a tunnel diode 22. The tunnel diode 22 is coupled through a coupling device 23 to a second tunnel diode 24. The coupling device is designed to provide either substantially zero phase shift or 180° phase shift depending on the biasing and poling of the diodes 22 and 24. By way of example, the coupling device 23 may comprise a bifilar transformer to provide zero phase shift or 180° phase shift, depending on the connections to the transformer. Also, if desired the coupling device 23 may comprise a transformer with suitable additional phase shifting elements if necessary to insure that the signal voltage in the secondary winding is either in phase or 180° out of phase with the signal voltage in the primary winding.

A suitable utilization circuit, not shown, but having an equivalent conductance represented by the resistor 26, shown in dashed lines, is coupled across the tunnel diode 24. Means providing a biasing voltage source for the tunnel diode 22 is connected between the terminals 27 and 28, and means providing a biasing voltage source for the tunnel diode 24 are connected between the terminals 29 and 30. A pair of capacitors 32 and 34 which have low impedance at signal frequencies, are connected between the terminals 27 and 29 respectively and ground.

Both of the diodes 22 and 24 are biased for stable operation in the negative resistance regions of their operating characteristics by their respective biasing voltage sources. As mentioned above, for stable biasing in the negative resistance region, the D.C. resistance in shunt with a tunnel diode must be less than the absolute value of the negative resistance exhibited by the diode. For stable amplification, the total shunt positive alternating current (A.C.) conductance in the circuit primarily due to the equivalent conductances of the signal source and utilization circuits must exceed the total negative conductance of the diodes 22 and 24.

In accordance with the invention, both of the tunnel diodes 22 and 24 are biased at either point A or point B, as shown in FIGURE 2c, if there is no phase shift through the coupling device 23. If there is a 180° phase shift in the signal through the coupling device 23, the diode 22 is biased at the point A and the diode 24 is biased at point B or vice versa. In this regard it is noted that the biasing points A and B are located approximately although not necessarily, at the midpoint between zero and the maximum negative conductance.

Under any of the foregoing conditions an applied signal voltage causes opposite changes in the conductance of the diodes 22 and 24, whereby the total average conductance, and therefore the gain, remains substantially constant for signals having a peak-to-peak amplitude equal to $E_M - E_A$. For example, considering the case where there is no phase shift through the coupling device 23, as an applied signal swings positively with respect to ground, the diode 22 is driven further in the forward bias direction, and the forward bias in the tunnel diode 24 is reduced. Assuming that both diodes are biased at point A it will be seen from FIGURE 2c, that the signal voltage swing in the positive direction increases the negative conductance in the diode 22 and reduces the negative conductance in the diode 24. With the signal voltage swinging negative, the changes in the conductances of the diodes are reversed, that is the conductance of the diode 22 decreases and the conductance of the diode 24 increases. It has been found that the change in conductance in the two diodes is substantially equal for signal voltage swings between $E_M$ and $E_A$ so that there is substantially no resultant change in the conductance and hence gain of the amplifier circuit. If the biasing points A and B are at the midpoint between zero and the maximum negative conductance, the signal swing that may be applied to the circuit without appreciable distortion is maximum.

With both diodes biased at point B the situation is reversed. Again assuming no phase shift through the coupling device 23, the applied signal voltage swinging positively with respect to ground causes the diode 22 to be driven further in the forward direction, and the forward bias on the diode 24 to be reduced as in the previous case. However, since the diodes are biased at point B as shown in FIGURE 2c, signal voltage swings in the positive direction decreases the conductance of the diode 22 and increases the conductance of the diode 24. These changes are substantially equal and in opposite directions so that the total average conductance of the amplifier circuit again remains substantially constant.

In the case where there is a 180° phase shift through the coupling device 23, the tunnel diode 22 is biased at point A and the tunnel diode 24 is biased at point B, or vice versa. Assuming the tunnel diode 22 to be biased at point A, a positively swinging signal causes an increase in the conductance of this diode. The 180° phase shifted signal causes the tunnel diode 24 which is biased at point B, to be driven further in the forward direction. This means that the conductance of the tunnel diode 24 is decreased by the negatively swinging signal applied thereto. On the alternate half cycle, a negatively swinging signal reduces the conductance of the diode 22, and this signal 180° phase shifted drives the diode 24 in the lower conductance direction. By proper selection of the diode biasing points which may be a function of the specific diode characteristics, it has been found that the resultant change in conductance of the circuit as a whole may be maintained very small over a relatively wide operating range of applied signal voltages. If the average conductance of the amplifier circuit described above remains substantially constant over a relatively wide signal range, then large signals may be effectively amplified without large amounts of distortion.

Figure 4:
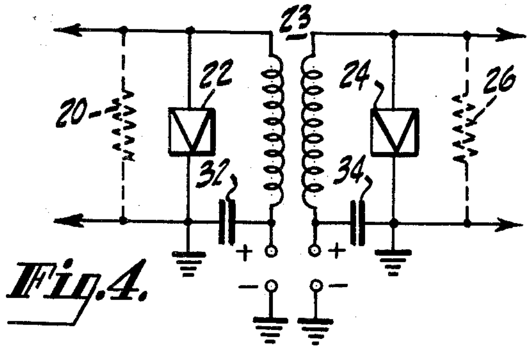
FIGURE 4 is a schematic circuit diagram of a modification of the negative resistance amplifier shown in FIGURE 3.

Reference is now made to the schematic circuit diagram as shown in FIGURE 4 which is the same as that shown in FIGURE 3 with the exception that the anode to cathode poling of the tunnel diode 24 has been reversed. If the coupling device 23 does not cause any phase shift of the signal therethrough, then the tunnel diodes 22 and 24 are biased at point A and point B respectively or at point B and point A respectively. If the coupling device 23 does provide a 180° phase shift in the signal therethrough, then the tunnel diodes 22 and 24 should both be biased at point A or at point B.

The operation of the circuit is similar to that described above in connection with FIGURE 3 in that an applied signal voltage causes the conductances of the two diodes to vary in opposite directions and the variations in conductance are substantially equal. As a general rule it may be said of the circuits of FIGURES 3 and 4 that if the two diodes are coupled by the transformer and their connection thereto to receive together increasing voltage in the forward direction with signal swing or both together receive decreasing voltage in the forward direction with signal swing, then the diodes should be biased on opposite sides of the inflection point, and preferably respectively midway between the point of minimum conductance and the points of zero conductance.

If the two diodes are coupled by the transformer and their connection thereto to receive voltage with one increasing in the forward direction and the other decreasing in the forward direction with signal swing, then the diodes should both be biased at the same point on one side or the other of the inflection point, the bias point being midway between the point of minimum conductance and the point of zero conductance on that side.

Figure 5:
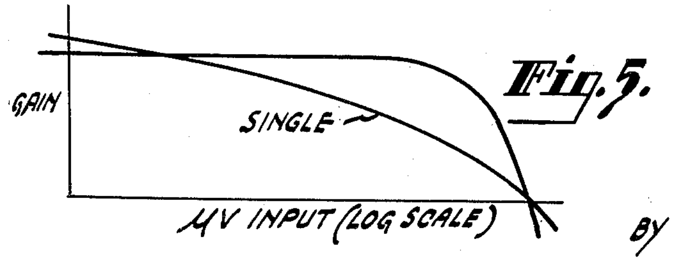
FIGURE 5 is a graph showing the relative gain characteristics of a negative resistance amplifier circuit embodying the invention with that of negative resistance amplifier circuits using a single negative resistance device of the type shown in FIGURE 1.

FIGURE 5 is a graph illustrating the gain of a negative resistance amplifier employing tunnel diodes in accordance with the invention as contrasted with the gain of a negative resistance amplifier using a single tunnel diode biased at the maximum negative conductance point. It will be noted that the gain of the circuit in accordance with the invention remains substantially flat over a wide range of input signal voltages and then drops off rather sharply. The gain of the amplifier using a single tunnel diode decreases substantially linearly to zero about the same point that the gain of the amplifier circuit in accordance with the invention drops to zero. It should be pointed out that the reason for the more or less uniform drop in gain of the amplifier employing a single tunnel diode as the type known heretofore is that an increase in signal level results in a reduction of the average negative conductance of the device, thereby resulting in a larger net positive resistance in the circuit which means that less gain can be achieved.

What is claimed is:

1. An electrical circuit comprising a first and a second negative resistance device; means for biasing said first negative resistance device such that an increase in forward bias applied to said first device causes a change in one direction in the negative resistance of said device, and a decrease in the forward bias applied to said first device causes a change in the opposite direction in the negative resistance of said first device; means for biasing said second negative resistance device such that a decrease in forward bias applied to said second device causes a change in said one direction in the negative resistance of said second device, and an increase in the forward bias applied to said second device causes a change in said opposite direction in the negative resistance of said second device; and means for coupling said first negative resistance device to said second negative resistance device so that a signal wave across said first device causes a change in conductance in said first device which is substantially equal in magnitude but opposite in direction to the change in conductance that said signal wave causes in said second device.

2. An amplifying system comprising an input terminal, an output terminal and a common terminal, signal coupling means providing a substantially 180 degree phase shift coupling said input and common terminals with said output and common terminals, a first negative resistance diode connected betweeen said input terminal and said common terminal, a second negative resistance diode connected between said output terminal and said common terminal, like electrodes of said first and second diodes connected to said input and output terminals respectively, means for biasing one of said diodes to a point on its negative resistance characteristics such that an increase in forward bias produces an increasing conductance, and means for biasing the other of said diodes to a point on its negative resistance characteristics such that an increase in forward bias produces a decreasing conductance, so that an applied signal wave produces substantially equal and opposite changes in said conductances of said diodes whereby the average negative conductance of said diodes remains substantially constant over a range of applied signal amplitudes.

3. An amplifying system comprising an input terminal, an output terminal and a common terminal, signal coupling means providing a substantially zero phase shift coupling said input and common terminals with said output and common terminals, a first negative resistance diode connected between said input terminal and said common terminal, a second negative resistance diode connected between said output terminal and said common terminal, like electrodes of said first and second diodes connected to said input and output terminals respectively, means for biasing one of said diodes to a point on its negative resistance characteristics such that an increase in forward bias produces an increasing conductance, and means for biasing the other of said diodes to a point on its negative resistance characteristic such that an increase in forward bias produces a decreasing conductance, so that an applied signal wave produces substantially equal and opposite changes in said conductances of said diodes whereby the average negative conductance of said diodes remain substantially constant for a range of applied signal amplitudes.

4. An electrical circuit comprising a first and second negative resistance diode; means for coupling together like electrodes of said diodes; and means for biasing said negative resistance diodes to exhibit a negative resistance, the biasing point of said diodes, the connection of said diodes in said electrical circuit, and said coupling means being arranged so that a signal applied to said diodes causes substantially equal and opposite changes in the conductances of said diodes.

5. In an amplifier circuit, a pair of diodes each having a negative resistance voltage current characteristic portion with a point of inflection and points of substantially infinite resistance on each side of said point of inflection, input circuit means for applying a signal voltage to one of said pair of diodes, means for coupling said diodes to apply said signal voltage to the other of said pair of diodes, means for forward biasing said one diode to a negative resistance operating point between said point of inflection and one of said infinite resistance points, and means for forward biasing said other diode to a negative resistance operating point such that signal voltage variations cause the negative conductance of said other diode to vary in substantially equal amounts but opposite directions to the negative conductance variations which said signal voltage causes in said one diode whereby the total average conductance of the amplifier circuit remains substantially constant with variations in signal voltage.

References Cited in the file of this patent

UNITED STATES PATENTS

| | | |
|---|---|---|
| 1,987,440 | Habann | Jan. 8, 1935 |
| 2,522,395 | Ohl | Sept. 12, 1950 |
| 2,565,497 | Harling | Aug. 28, 1951 |

FOREIGN PATENTS

| | | |
|---|---|---|
| 1,246,094 | France | Oct. 3, 1960 |